(12) United States Patent
Yang et al.

(10) Patent No.: US 7,605,081 B2
(45) Date of Patent: Oct. 20, 2009

(54) SUB-LITHOGRAPHIC FEATURE PATTERNING USING SELF-ALIGNED SELF-ASSEMBLY POLYMERS

(75) Inventors: Haining Yang, Wappingers Falls, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 11/424,963

(22) Filed: Jun. 19, 2006

(65) Prior Publication Data

US 2007/0293041 A1 Dec. 20, 2007

(51) Int. Cl.
*H01L 21/44* (2006.01)
(52) U.S. Cl. ............... 438/672; 438/725; 257/E21.577
(58) Field of Classification Search ............... 430/5; 438/672, 725; 257/E21.577, E21.487, E21.254, 257/E21.244, E21.233, E21.232
See application file for complete search history.

(56) References Cited

U.S. PATENT DOCUMENTS 5,869,364 A * 2/1999 Nakano et al. ............... 438/167
7,459,793 B2 * 12/2008 Harada et al. ............... 257/774
2007/0224823 A1 * 9/2007 Sandhu ............... 438/694
2007/0281220 A1 * 12/2007 Sandhu et al. ............... 430/5

OTHER PUBLICATIONS

Black, C.T. "Integration of Self Assembly for Semiconductor Microelectronics." IEEE (2005) p. 87-91.
Nealey, Paul F. et al. "Self-Assembling Resists for Nanolithography." IEEE (2005).
Black, C.T. "Nanometer-Scale Pattern Registration and Alignment by Directed Diblock Copolymer Self-Assembly." IEEE (2004).

* cited by examiner

*Primary Examiner*—W. David Coleman
(74) *Attorney, Agent, or Firm*—Scully, Scott, Murphy & Presser, P.C.; H. Daniel Schnurmann

(57) ABSTRACT

A method for conducting sub-lithography feature patterning of a device structure is provided. First, a lithographically patterned mask layer that contains one or more mask openings of a diameter d is formed by lithography and etching over an upper surface of the device structure. Next, a layer of a self-assembling block copolymer is applied over the lithographically patterned mask layer and then annealed to form a single unit polymer block of a diameter w inside each of the mask openings, provided that w<d. Each single unit polymer block of the present invention is embedded in a polymeric matrix and can be selectively removed against the polymeric matrix to form a single opening of the diameter w in the polymeric matrix inside each of the mask openings. Sub-lithography feature patterning can then be conducted in the device structure using the single openings of diameter w.

10 Claims, 10 Drawing Sheets ered array of repeating structural units formed by self-assembling block copolymers could not be used in CMOS devices, because of lack of alignment or registration of the position of individual structure unit.

SUB-LITHOGRAPHIC FEATURE PATTERNING USING SELF-ALIGNED SELF-ASSEMBLY POLYMERS

FIELD OF THE INVENTION

The present invention generally relates to sub-lithographic feature patterning for semiconductor technology using self-aligned self-assembly polymers.

BACKGROUND OF THE INVENTION

The current state of the art and future CMOS technology requires sub-50 nm metal contacts for connecting the CMOS devices, such as field effect transistors (FETs), to the back-end-of-line (BEOL) wiring. However, the currently available 0.93 numerical aperture (NA) lithographic tool can only resolve lithographic patterns with contact openings of not less than 100 nm in diameter. Future generation of 1.2 NA lithographic tool is expected to print lithographic patterns with contact openings of about 70 nm to 80 nm in diameter. The large contact opening diameter contributes to an undesirable low device density on the integrated chip.

Therefore, there is a need for reducing the CMOS contact opening diameter to even below the resolutions of the lithographic tools, i.e., there is a need for sub-lithography feature patterning.

It has been known that certain materials are capable of spontaneous organization of materials into ordered patterns without the need for human interference, which is typically referred to as the self-assembly of materials. Examples of material self-assembly range from snowflakes to seashells to sand dunes, all of which form some type of regular or ordered patterns in response to the external conditions.

Among various self-assembling materials, self-assembling block copolymers that are capable of self-organizing into nanometer-scale patterns are particularly promising for enabling future advances in the semiconductor technology. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools). Further, the self-assembling block copolymers are compatible with conventional semiconductor, optical, and magnetic processes. Therefore, the ordered patterns of nano-sized structural units formed by such block copolymers have been integrated into semiconductor, optical, and magnetic devices where a large, ordered array of repeating structural units are required.

However, the CMOS technology requires precise placement or registration of individual structural units for formation of metal lines and vias in the wiring levels. Therefore, the large, ordered array of repeating structural units formed by self-assembling block copolymers could not be used in CMOS devices, because of lack of alignment or registration of the position of individual structure unit.

SUMMARY OF THE INVENTION

The present invention provides a method that combines a conventional lithographic technology with the self-assembling block copolymer technology to achieve self-aligned individual structural units for sub-lithographic feature patterning in CMOS devices.

In one aspect, the present invention relates to a method of forming patterned features in a device structure, comprising:

forming a lithographically patterned mask layer over an upper surface of the device structure, wherein the lithographically patterned mask layer comprises one or more mask openings of a diameter d;

applying a layer of a block copolymer over the lithographically patterned mask layer, wherein the block copolymer comprises at least first and second polymeric block components A and B, respectively, that are immiscible with each other;

annealing the block copolymer layer to form a single unit polymer block of a diameter w inside each of the mask openings, wherein w<d, and wherein each single unit polymer block comprises the second polymeric block component B and is embedded in a polymeric matrix that comprises the first polymeric block component A;

selectively removing the second polymeric block component B relative to the first polymeric block component A to form a single opening of the diameter w in the polymeric matrix inside each of said mask openings; and patterning the device structure using the single openings of diameter w.

The block copolymer of the present invention, when placed and annealed on a planar surface, self-assemblies into an ordered array of multiple unit polymer blocks embedded in the polymeric matrix, wherein each of the multiple unit polymer blocks has the diameter w, and the multiple unit polymer blocks are spaced apart from each other in the ordered array by a distance s.

When w<d<3w+2s, a single unit polymer block is formed inside and self-aligned to each mask opening. More preferably, (w+s)/2<d<2w+2s. For example, when w ranges from about 10 nm to about 50 nm and s ranges from about 20 nm to about 60 nm, d may range from about 40 nm to about 200 nm.

The block copolymer of the present invention preferably comprises the first and second polymeric block components A and B at a weight ratio from about 80:20 to about 60:40, and the single unit polymer block comprises a cylinder that stands perpendicular to the upper surface of the device structure.

Suitable block copolymers that can be used in the present invention include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

In a particular preferred, but not necessary, embodiment of the present invention, the block copolymer comprises PS-b-PMMA having a PS:PMMA weight ratio ranging from about 80:20 to about 60:40.

Annealing of the block copolymer layer is preferably, but not necessarily, conducted by either thermal annealing or ultra-violet light treatment.

The device structure of the present invention may comprise any semiconductor device. Preferably, the device structure comprises a field effect transistor (FET) covered by an interlevel dielectric (ILD) layer, and the single openings are used for forming one or more contact openings that extend through the ILD layer to the FET in the device structure. Further, the mask openings in the lithographically patterned mask layer are formed by lithography and etching.

Another aspect of the present invention relates to a semiconductor structure, which comprises:

a device structure having an upper surface; and a lithographically patterned mask layer located over the upper surface of the device structure, wherein the lithographically patterned mask layer comprises one or more mask openings of a diameter d, wherein each of the mask openings comprises a single unit polymer block of a diameter w that is located therein and is embedded in a polymeric matrix, wherein w<d, wherein each single unit polymer block comprises a first polymeric block component A of a block copolymer, wherein the polymeric matrix comprises a second polymeric block component B of the block copolymer, and wherein the first and second polymeric block components A and B are immiscible with each other.

A further aspect of the present invention relates to a semiconductor structure comprising a device structure having an upper surface and a lithographically patterned mask layer located over the upper surface of the device structure, wherein the lithographically patterned mask layer comprises one or more mask openings of a diameter d, wherein each of the mask openings is filled with a polymeric matrix that comprises a single opening of a diameter w, and wherein w<d.

Other aspects, features and advantages of the invention will be more fully apparent from the ensuing disclosure and appended claims.

DETAILED DESCRIPTION OF THE INVENTION AND PREFERRED EMBODIMENTS

Figure 1A:
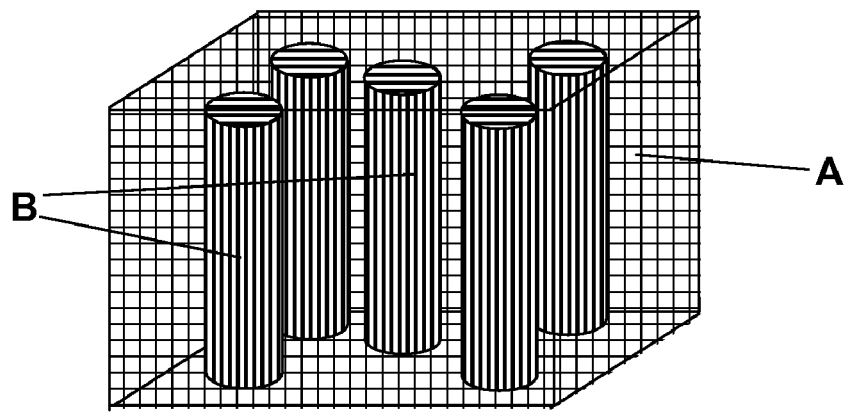
FIG. 1A shows a three-dimensional view of a pattern that is formed by a block copolymer with first and second polymeric block components A and B, while the pattern comprises an ordered array of cylinders composed of the polymeric block component B in a polymeric matrix composed of the polymeric block component A.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The term "annealing" or "anneal" as used herein refers to treatment of the self-assembling block copolymer so as to allow sufficient phase separation between the two or more different polymeric block components of the self-assembling block copolymer in forming an ordered pattern defined by repeating structural units. Annealing of the self-assembling block copolymer in the present invention can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), or supercritical fluid-assisted annealing. As a specific example, thermal annealing of the self-assembling block copolymer can be conducted at an elevated temperature that is above the glass transition temperature ($T_g$), but below the degradation temperature ($T_d$) of the self-assembling block copolymer, as described in greater detail hereinafter. Other well-known annealing methods will not be been described in detail, in order to avoid obscuring the invention. As an alternative example, the self-assembling block copolymer can be annealed by ultra-violet treatment.

The present invention combines the conventional lithography technology with the self-assembling block copolymer technology to form sub-lithographic structural units that can be individually formed inside and self-aligned to a lithographic feature over a device structure for sub-lithographic patterning of the device structure.

Specifically, a mask layer is first formed over the device structure to be patterned. One or more mask openings are then formed in the mask layer by conventional lithography and etching techniques, and such mask openings each has a relatively large diameter (d) that is consistent with the resolutions of the conventional lithographic technology. A thin layer of a self-assembling block copolymer (having a thickness typically ranging from about 20 nm to about 100 nm) is then applied over the device structure and annealed to form an ordered pattern containing repeating structural units. The diameter of the mask openings is carefully adjusted so that only a single unit polymer block can be formed inside each mask opening from the self-assembling block copolymer. The single unit polymer block is embedded in a polymeric matrix that is in turn located inside the mask opening, and it has a diameter (w) that is smaller than the diameter of the mask openings. The single unit polymer block can be selectively removed relative to the polymeric matrix, thereby leaving a single opening of the smaller diameter (w) in the polymeric matrix inside each mask opening. Each single opening can then be used for sub-lithographic patterning of the device structure.

There are many different types of block copolymers that can be used for practicing the present invention. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B. Further, the block copolymer can have any one of the following formula:

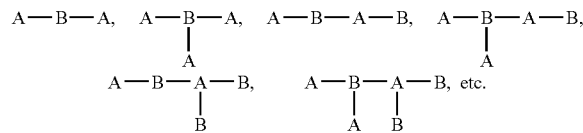

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

Figure 1B:
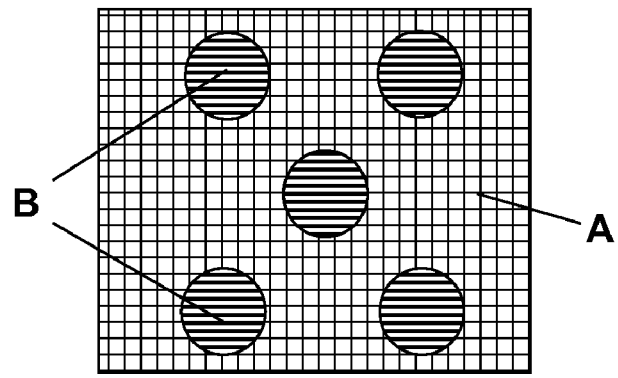
FIG. 1B shows the top view of the pattern of FIG. 1A.

In a preferred embodiment of the present invention, the ratio of the molecular weight of the first polymeric block component A over the molecular weight of the second polymeric block component B ranges from about 80:20 to about 60:40, so that the block copolymer of the present invention will form an ordered array of cylinders composed of the second polymeric block component B in a matrix composed of the first polymeric block component A, as shown in FIGS. 1A and 1B.

Figure 2:
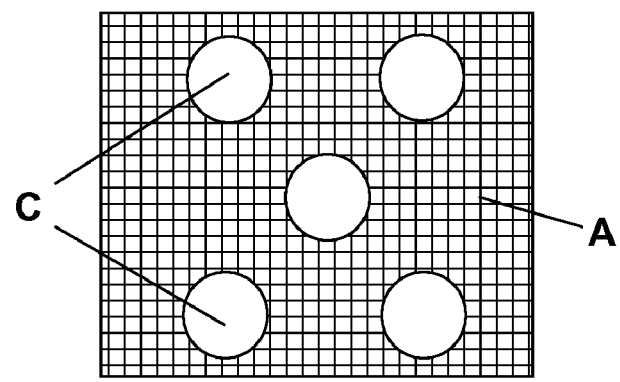
FIG. 2 shows a top view a pattern formed from the pattern of FIGS. 1A and 1B by selective removing the polymeric block component B against the polymeric block component A.

Preferably, one of the components A and B can be selectively removable relative to the other, thereby resulting in either isolated and orderly arranged structural units composed of the un-removed component, or a continuous structural layer containing isolated and orderly arranged cavities left by the removable component. For example, when the second polymeric block component B is selectively removable relative to the first polymeric block component A, isolated and orderly arranged cavities C can be formed by selectively removing the cylinders composed of second polymeric block component B, as shown in FIG. 2.

In a particularly preferred embodiment of the present invention, the block copolymer used for forming the self-assembled periodic patterns of the present invention is PS-b-PMMA with a PS:PMMA molecular weight ratio ranging from about 80:20 to about 60:40.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028+3.9/T$, where T is the absolute temperature. Therefore, $\chi$ is approximately 0.0362 at 473K. ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %. In a particularly preferred embodiment of the present invention, the block copolymer solution comprises about 0.5 wt % to about 1.5 wt % PS-b-PMMA dissolved in toluene or PGMEA.

The block copolymer solution can be applied to the surface of a device structure by any suitable techniques, including, but not limited to: spin casting, coating, spraying, ink coating, dip coating, etc. Preferably, the block copolymer solution is spin cast onto the surface of a device structure to form a thin block copolymer layer thereon.

After application of the thin block copolymer layer onto the device surface, the entire device structure is annealed to effectuate micro-phase segregation of the different block components contained by the block copolymer, thereby forming the periodic patterns with repeating structural units.

As mentioned hereinabove, annealing of the block copolymer in the present invention can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. More preferably, the thermal annealing step is carried out an annealing temperature of about 200° C.-300° C. The thermal annealing may last from less than about 1 hour to about 100 hours, and more typically from about 1 hour to about 15 hours.

In an alternative embodiment of the present invention, the block copolymer layer is annealed by ultra-violet (UV) treatment.

Figure 3:
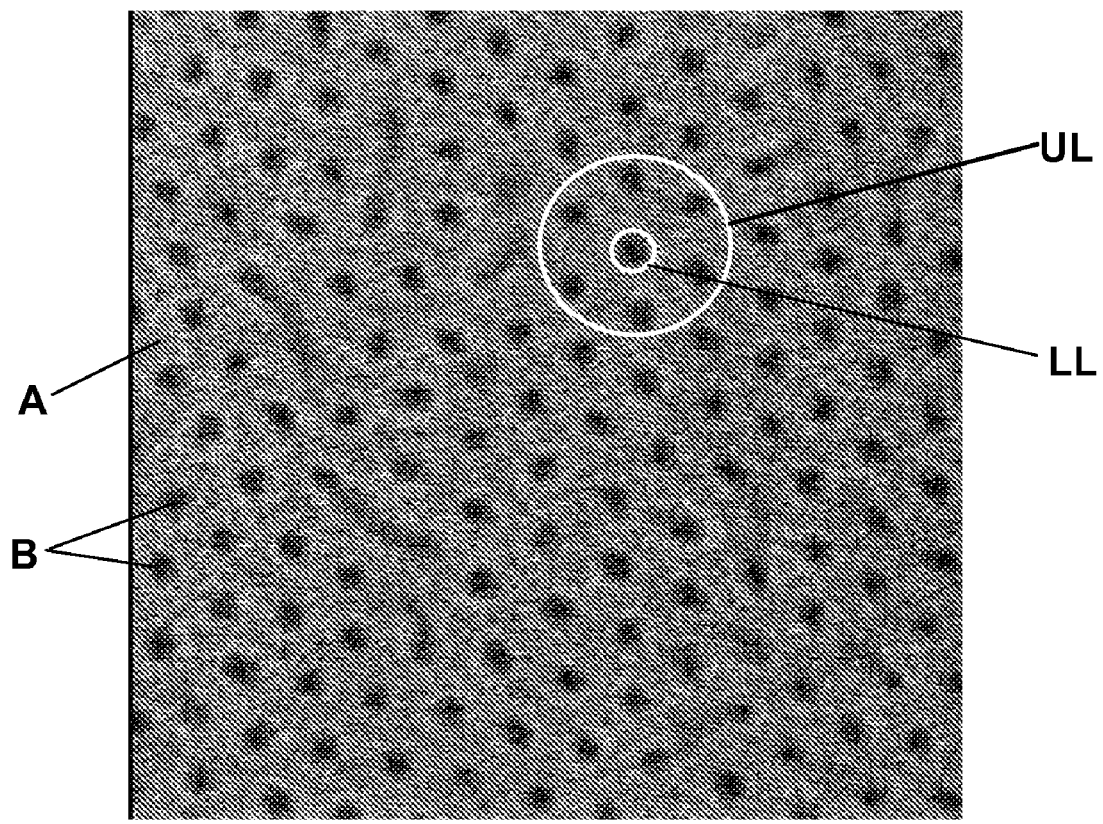
FIG. 3 shows a top-down scanning electron microscopic (SEM) photograph of a pattern formed by a block copolymer thin film that comprises first and second polymeric block components A and B, where the patterned contains an ordered array of cylinders composed of the polymeric block component B in a polymeric matrix composed of the polymeric block component A.

FIG. 3 shows a top-down scanning electron microscopic (SEM) photograph of an ordered pattern or array of repeating structure units B that are formed over a substantially planar surface from a block copolymer thin film. The repeating structural units B comprise cylinders that stand perpendicularly to the planar surface and are embedded in a polymeric matrix A. Each cylinder is surrounded by six cylinders, which form a perfect hexagon as shown in FIG. 3.

The present invention employs lithographic features to limit formation and placement of the structural units formed by the self-assembling block copolymer materials. More specifically, the lithographic features as used by the present invention have dimensions that are adjusted so that only a single unit polymer block can be formed and placed inside each lithographic feature from the self-assembling block copolymer.

Figure 4:
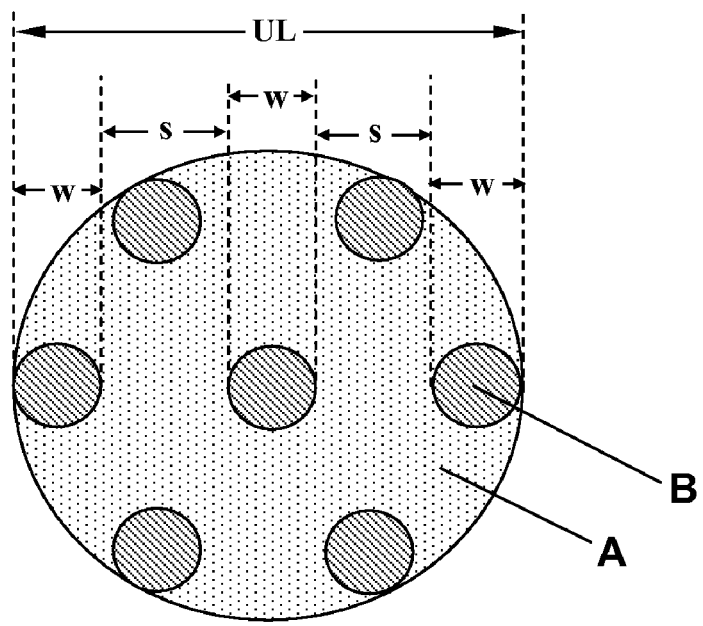
FIG. 4 illustrates the dimensions of the ordered array of cylinders as shown in FIG. 3 and the relative dimensions of a lithographic feature that can be used for precise placement of a single cylinder.

In order to achieve formation and placement of such a single structure unit, the lithographic feature employed in the present invention should have a dimension (d) that is above the lower limit (LL), but below the upper limit (UL), as shown in FIG. 3. When the structural units of FIG. 3 each has a diameter w and are spaced apart from each other by a distance s, the lower limit (LL) of d is preferably equal to the diameter w of a single unit polymer block, and the upper limit (UL) of d is preferably equal to the sum of 3w+2s, so that one and only one structural unit B can be formed inside the lithographic feature, as shown in FIG. 4. More preferably, d is more than (w+s)/2 but less than 2w+2s.

For a PS-b-PMMA block copolymer having a molecular weight ($M_n$) of about 64 Kg/mol and a PS:PMMA molecular weight ratio of about 70:30, the diameter w of a single unit polymer block typically ranges from about 10 nm to about 50 nm, more typically from about 15 nm to about 30 nm, and most typically from about 20 nm to about 25 nm. The spacing s between the structural units typically ranges from about 20 nm to about 60 nm, more typically from about 30 nm to about 50 nm, and most typically from about 40 nm to about 45 nm.

Therefore, the dimension d of the lithographic feature preferably ranges from about 40 nm to about 200 nm, more preferably from about 40 nm to about 130 nm, and most preferably from about 50 nm to about 110 nm.

In the present invention, one or more lithographic features of the diameter d, as described hereinabove, are first provided over a device structure to be patterned, followed by application and annealing of a thin layer of a self-assembly block copolymer. A single unit polymer block of the diameter w is consequently formed inside each lithographic feature. Specifically, the single unit polymer block is embedded in a polymeric matrix that is also located inside each lithographic feature, and the single unit polymer block can be selectively removed relative to the polymeric matrix to form a single opening of the diameter w in the polymeric matrix inside each lithographic feature. Such a single opening has a sub-lithographic dimension and can therefore be used for sub-lithographic patterning of the device structure, consistent with the present invention.

FIGS. 5A-12B are cross-sectional and top views that illustrate exemplary processing steps for forming sub-lithographic contact openings through an interlevel dielectric (ILD) layer to a field effect transistor (FET).

Figure 5A:
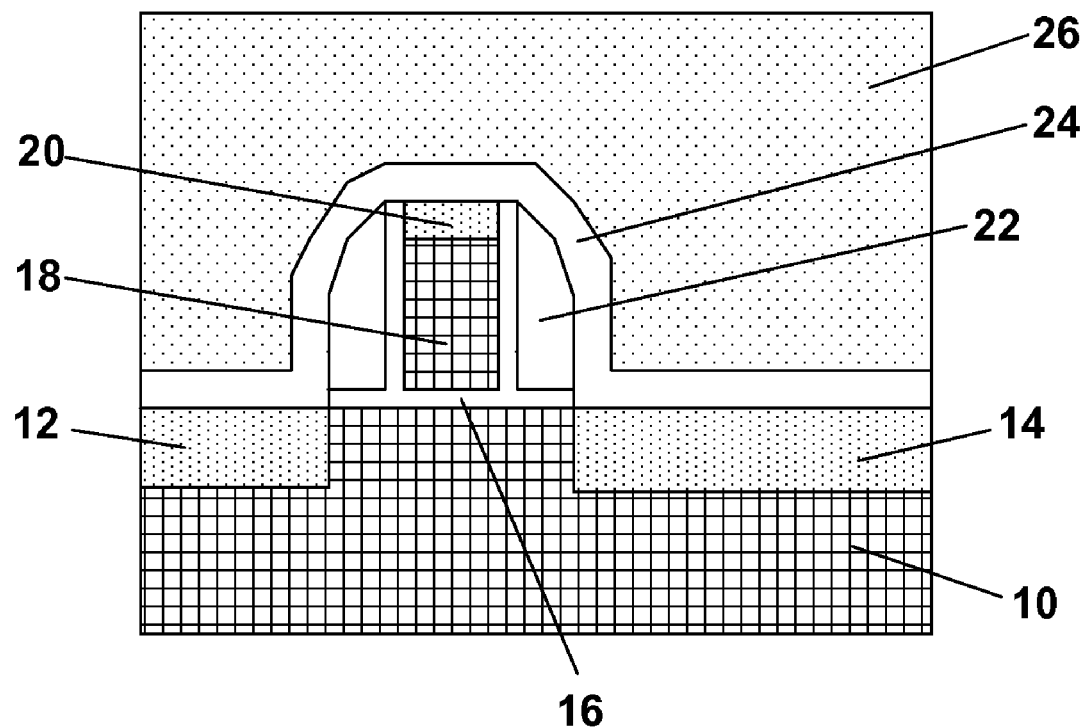
FIGS. 5A-12B are cross-sectional and top views that illustrate exemplary processing steps for forming sub-lithographic contact openings through an interlevel dielectric (ILD) layer to a field effect transistor (FET) thereunder.
Figure 5B:
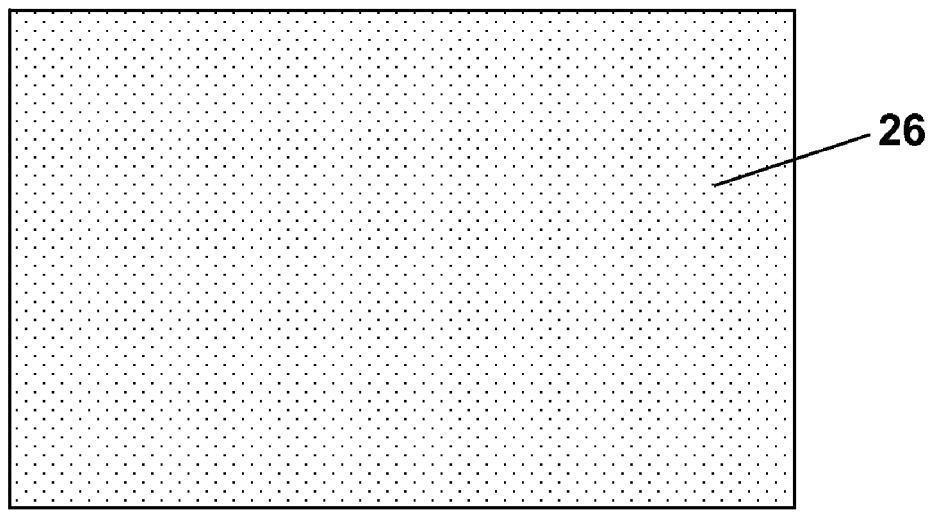

Specifically, FIG. 5A shows the cross-sectional view of an FET, which comprises source, drain, and channel regions (not shown) that are located in a semiconductor substrate 10 and a gate dielectric layer 16, a gate conductor 18, an optional sidewall spacer 22 and a dielectric cap layer 24 that are located over substrate 10. The source and drain regions (not shown) and the gate conductor 18 of the FET preferably, but not necessarily, contain metal silicide contacts 12, 14, and 20, respectively. A blanket interlevel dielectric (ILD) layer 26 covers the entire FET structure, as shown in FIG. 5B. The FET is formed by conventional techniques, the details of which are not described here in order to avoid obscuring the present invention.

Figure 6A:
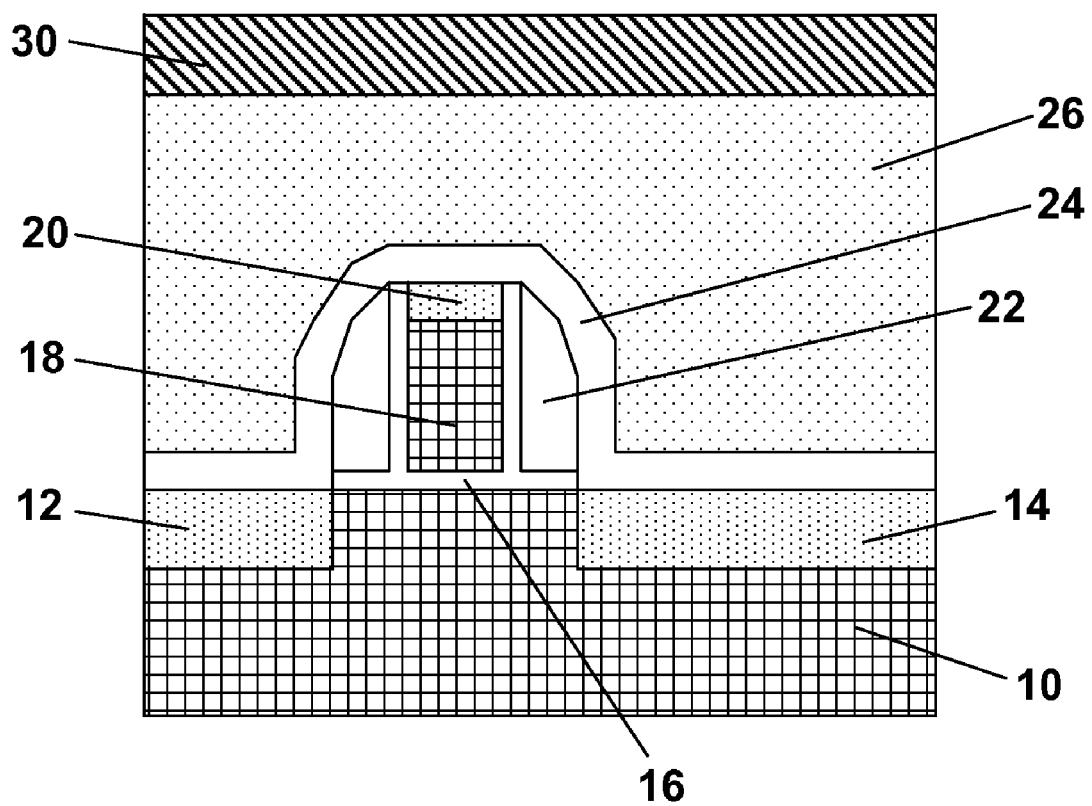
Figure 6B:
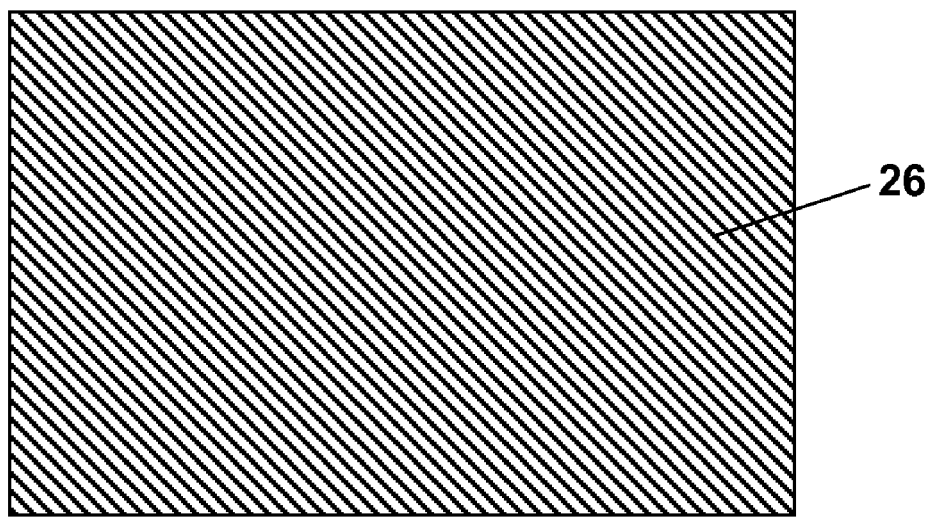

In order to form one or more contact openings of sub-lithographic sizes through the ILD layer 26 to provide access to the FET thereunder, a mask layer 30 (comprising either a hard mask or a soft mask material) is first formed over an upper surface of the ILD layer 26, as shown in FIGS. 6A and 6B. The mask layer 30 may comprise any suitable mask material, such as an oxide, nitride, or oxynitride, and it can be deposited by well known techniques such as chemical vapor deposition (CVD), plasma-assisted CVD, atomic layer deposition (ALD), evaporation, reactive sputtering, chemical solution deposition and other like deposition processes. Preferably, the mask layer 30 comprises silicon nitride and is deposited by a CVD process.

In a specific embodiment of the present invention, one or more additional mask layers (not shown) are provided underneath the mask layer 30 for subsequent patterning of the ILD layer 26. Such additional mask layers (not shown) are particularly useful for forming deep via openings through the ILD layer 26.

Figure 7A:
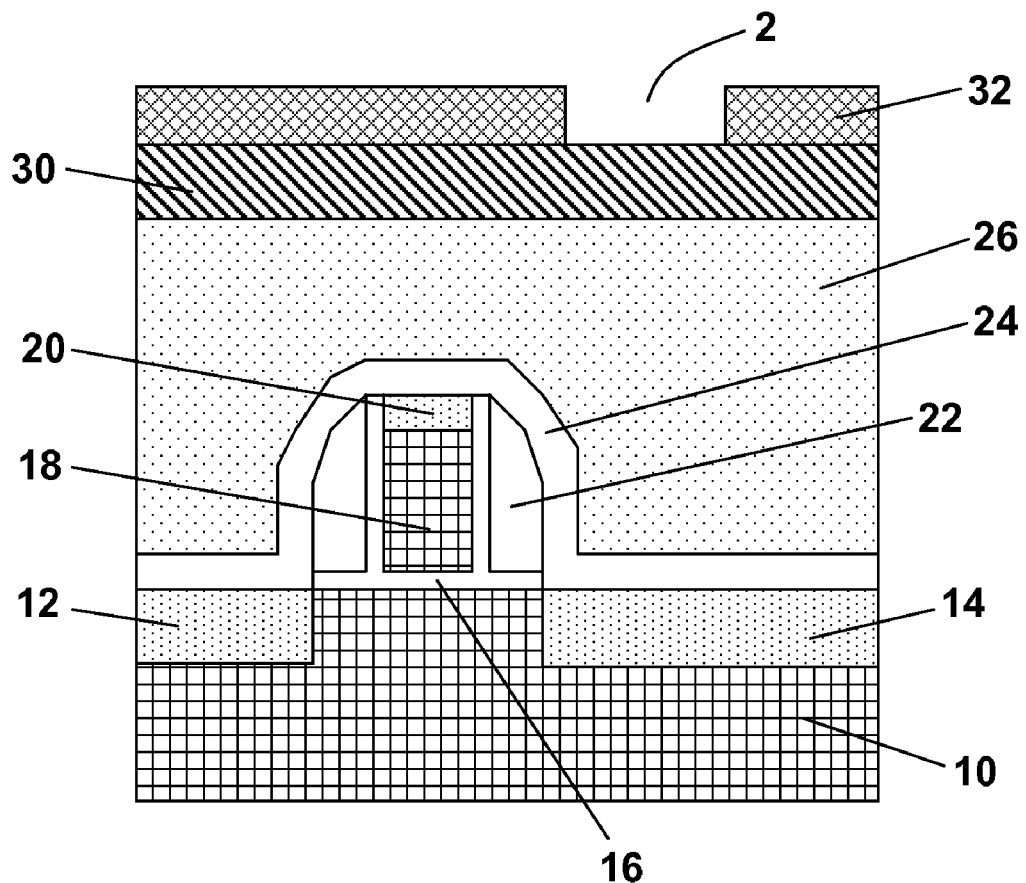
Figure 7B:
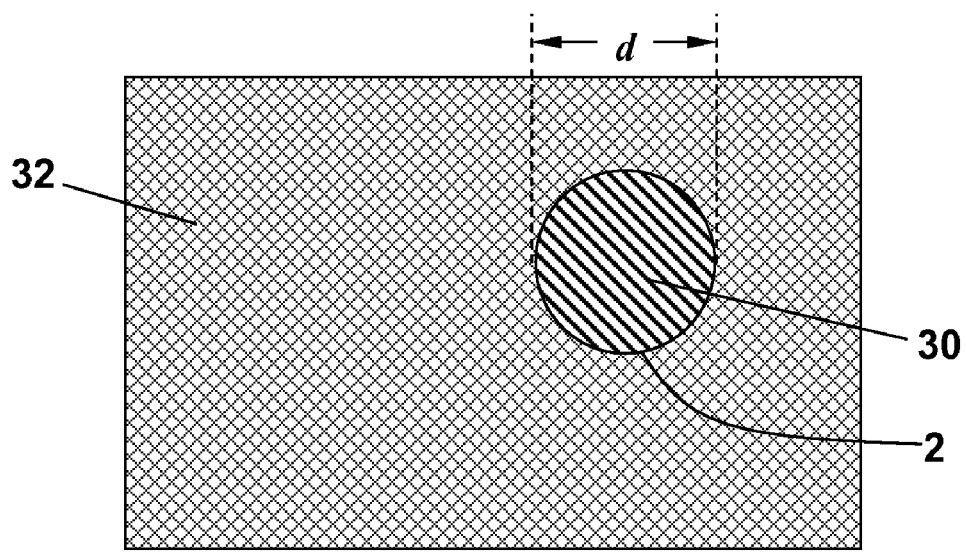

Next, a patterned resist layer 32 is formed over the mask layer 30, as shown in FIGS. 7A and 7B. The patterned resist 32 is formed by conventional lithography and resist development to define a lithographic opening 2 therethrough. Specifically, a blanket photoresist layer (not shown) is first applied to the upper surface of the mask layer 30, exposing the blanket photoresist layer (not shown) to a desired pattern of radiation and developing the exposed photoresist (not shown) utilizing a conventional resist developer to form the lithographic opening 2, which has a diameter d that ranges from about 60 nm to about 100 nm (more preferably from about 70 nm to about 90 nm), and the upper surface of the mask layer 30 is exposed through the lithographic opening 2, as shown in FIG. 7B.

Figure 8A:
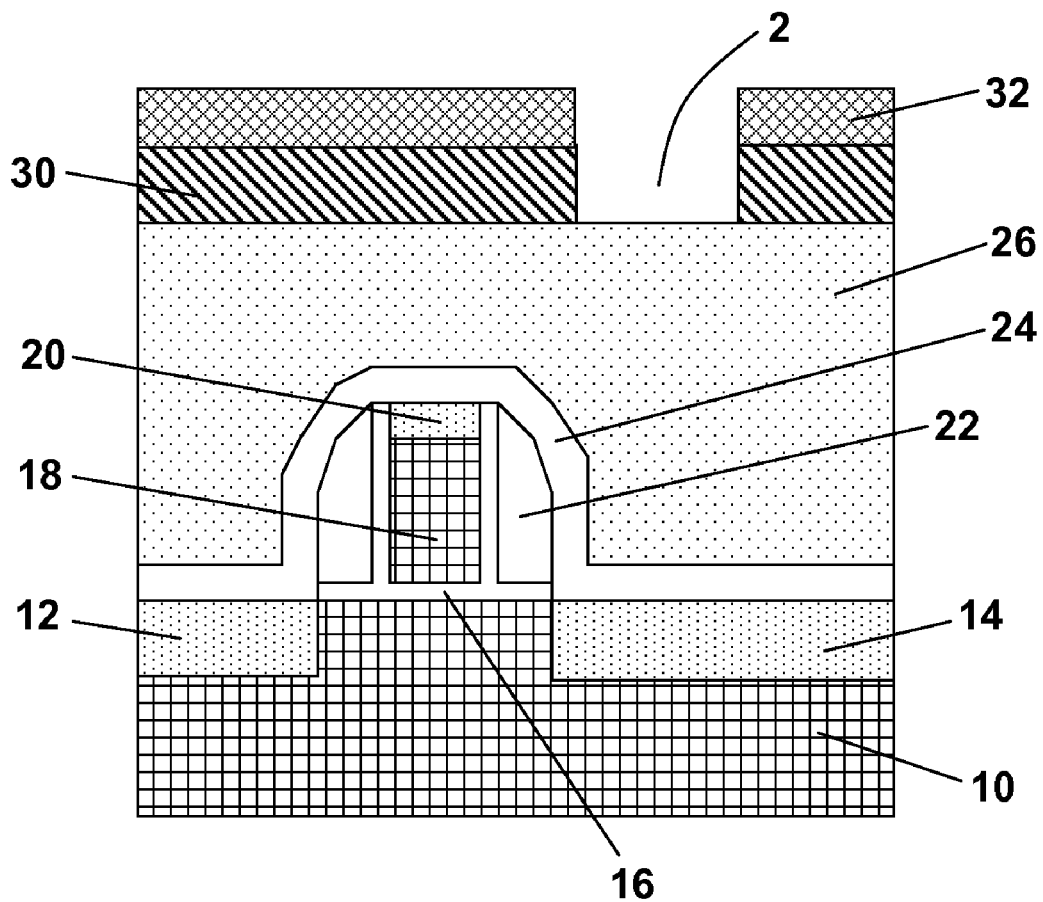
Figure 8B:
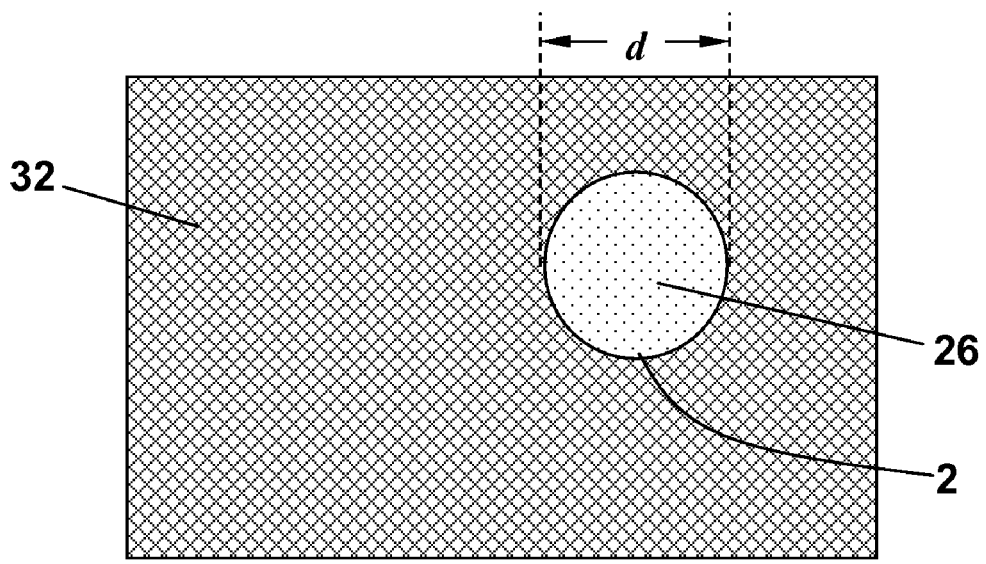

The lithographic opening 2 in the patterned resist layer 32 is then extended downward through the mask layer 30 utilizing one or more dry etching steps, and an upper surface of the ILD layer 26 is consequently exposed through the extended lithographic opening 2, as shown in FIGS. 8A and 8B. Suitable dry etching processes that can be used in the present invention include, but are not limited to: reactive ion etching (RIE), ion beam etching, plasma etching or laser ablation. The patterned photoresist layer 32 is then removed by resist stripping after etching has been completed, leaving only a lithographically patterned mask layer 30 with a mask opening 2 of the diameter d therein.

Optionally, but not necessarily, the interior surfaces of the mask opening 2 are treated before application of a block copolymer layer. Specifically, one or more surface layers are formed over the bottom surface and sidewall surfaces of the mask opening 2, so as to provide the desired wetting properties for aligning the cylindrical unit polymeric block to be formed in the mask opening 2 by the block copolymer layer.

The wetting properties as discussed herein refer to the surface affinities of a specific surface with respect to the different block components of the block copolymers. For example, if a surface has substantially the same surface affinity to both block components A and B of a block copolymer, such a surface is considered a neutral surface or a non-preferential surface, i.e., both block components A and B can wet or have affinities to such a surface. In contrast, if a surface has significantly different surface affinities for the block components A and B, such a surface is then considered a preferential surface, i.e., only one of block components A and B can wet such a surface, but the other cannot.

Surfaces comprising one of silicon native oxides, silicon oxides, and silicon nitrides are preferentially wetted by PMMA block components, but not by PS block components. Therefore, such surfaces can be used as preferential surfaces for PS-b-PMMA block copolymers. On the other hand, a monolayer comprising a substantially homogenous mixture of PS and PMMA components, such as a random PS-r-PMMA copolymer layer, provides a neutral surface or a non-preferential surface for PS-b-PMMA block copolymers.

In order to form cylindrical polymeric blocks that are aligned perpendicular to the bottom surface of the mask opening 2 from PS-b-PMMA, it is desired to deposit a neutral or non-preferential monolayer (e.g., a substantially homogenous mixture of PS and PMMA components) over the bottom surface of the mask opening 2, while the sidewall surfaces of the mask opening 2, which preferably comprise silicon nitrides or oxides, are either left untreated or are coated with a preferential wetting material (e.g., silicon native oxides, silicon oxides, and silicon nitrides). In this manner, the cylindrical polymeric blocks formed from PS-b-PMMA will stand perpendicular to the bottom surface of the mask opening 2.

Figure 9A:
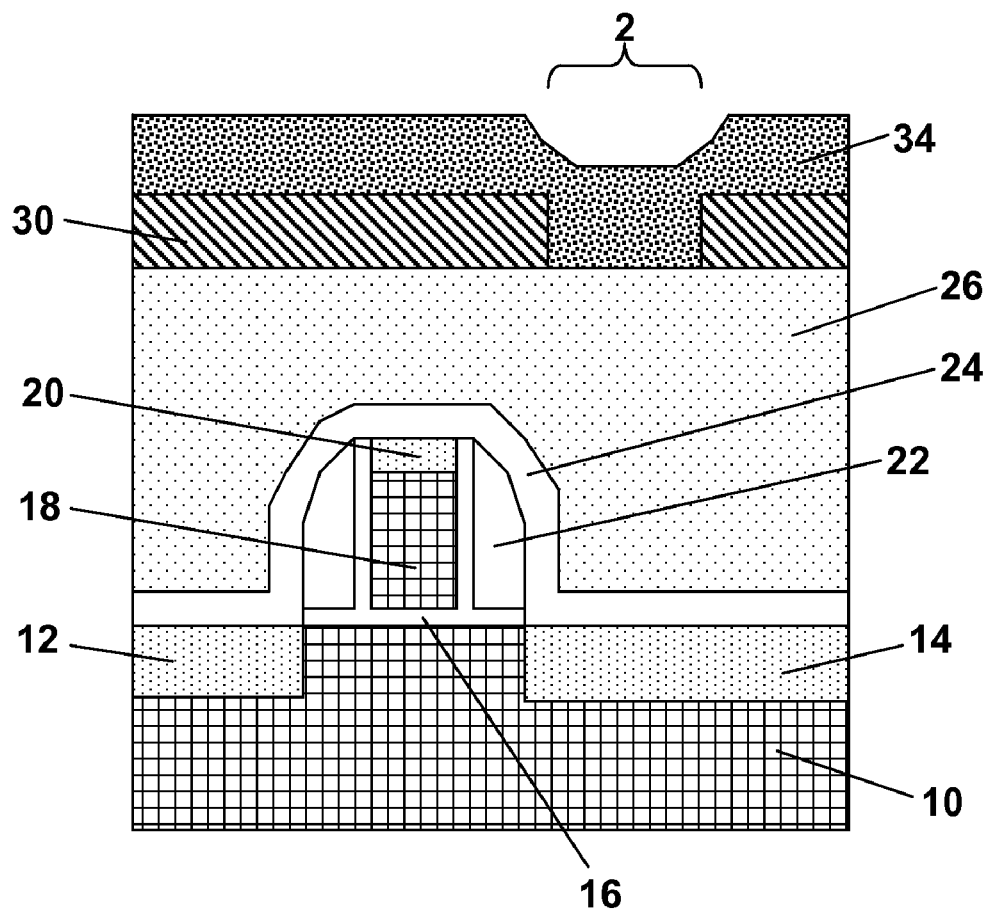
Figure 9B:
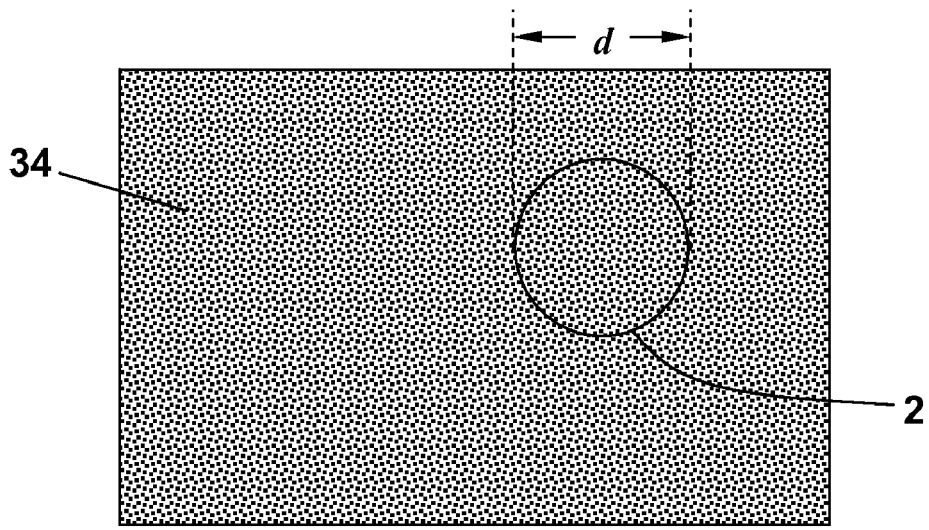

Next, a thin layer of a self-assembling block copolymer 34 is applied over the entire structure, including the mask opening 2, as shown in FIGS. 9A and 9B.

Figure 10A:
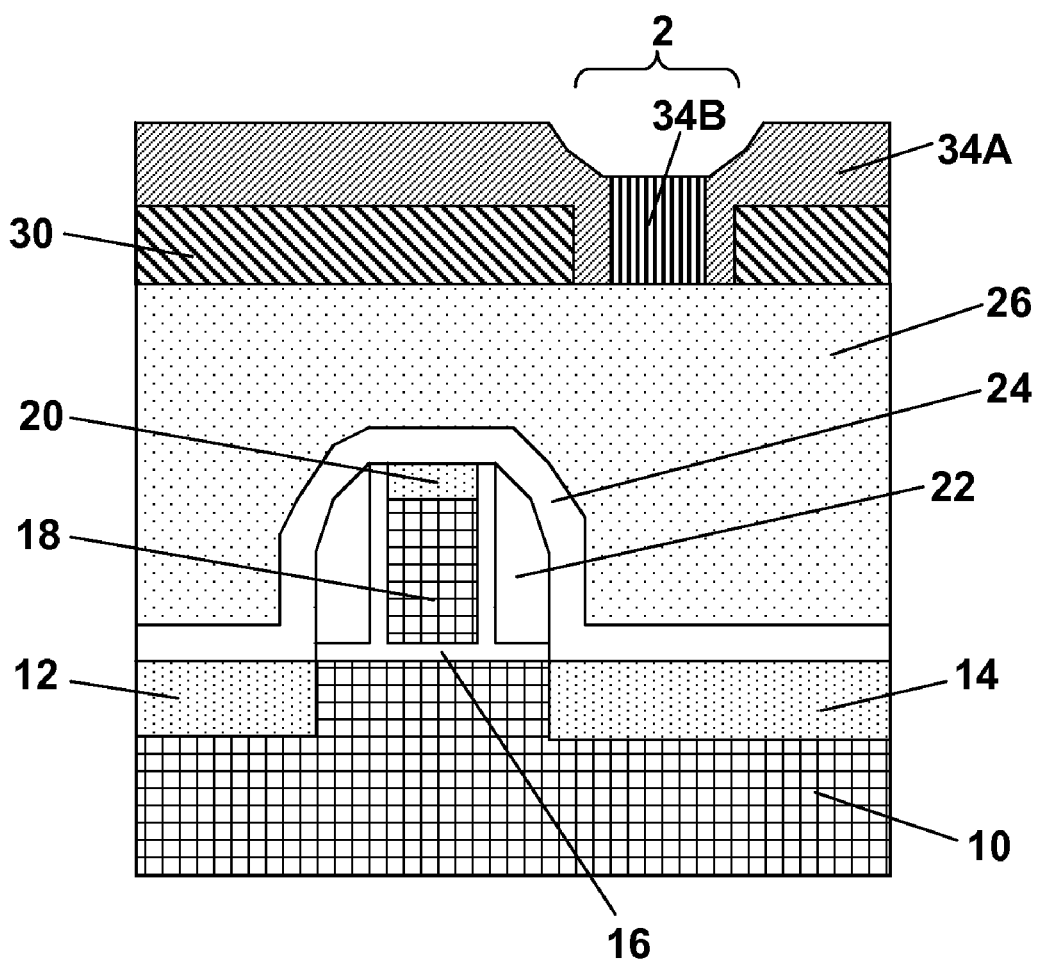
Figure 10B:
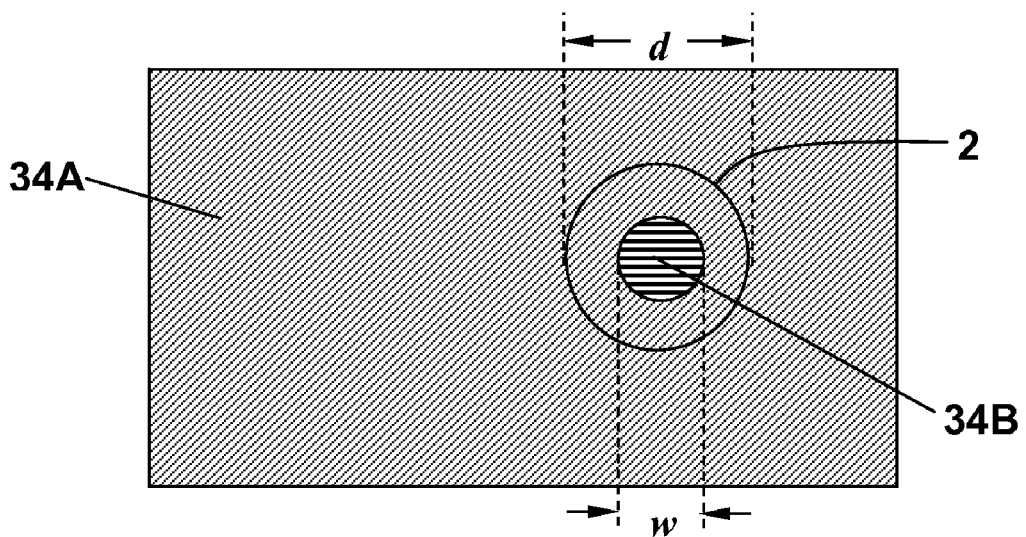

Preferably, but not necessarily, the self-assembling block copolymer 34 comprises PS-b-PMMA with a PS:PMMA molecular weight ratio of about 70:30 and a total molecular weight of about 64 Kg/mol. Such a PS-b-PMMA block copolymer, when placed and annealed on a substantially planar surface, is capable of forming highly uniform hexagonal lattices of PMMA cylinders in a PS matrix. Each PMMA cylinder has a diameter w of about 20 nm, and the spacing s between neighboring PMMA cylinders is about 40 nm. However, because of the presence of the mask opening 2 of the diameter d in the lithographically patterned mask layer 30, annealing of the self-assembling block copolymer 34 forms only a single PMMA cylinder 34A that is embedded in a PS matrix 34B inside the mask opening 2, as shown in FIGS. 10A and 10B. The single PMMA cylinder 34A has the diameter w of about 20 nm, which is significantly smaller than the diameter d of the mask opening 2 and is therefore sub-lithographic.

Figure 11A:
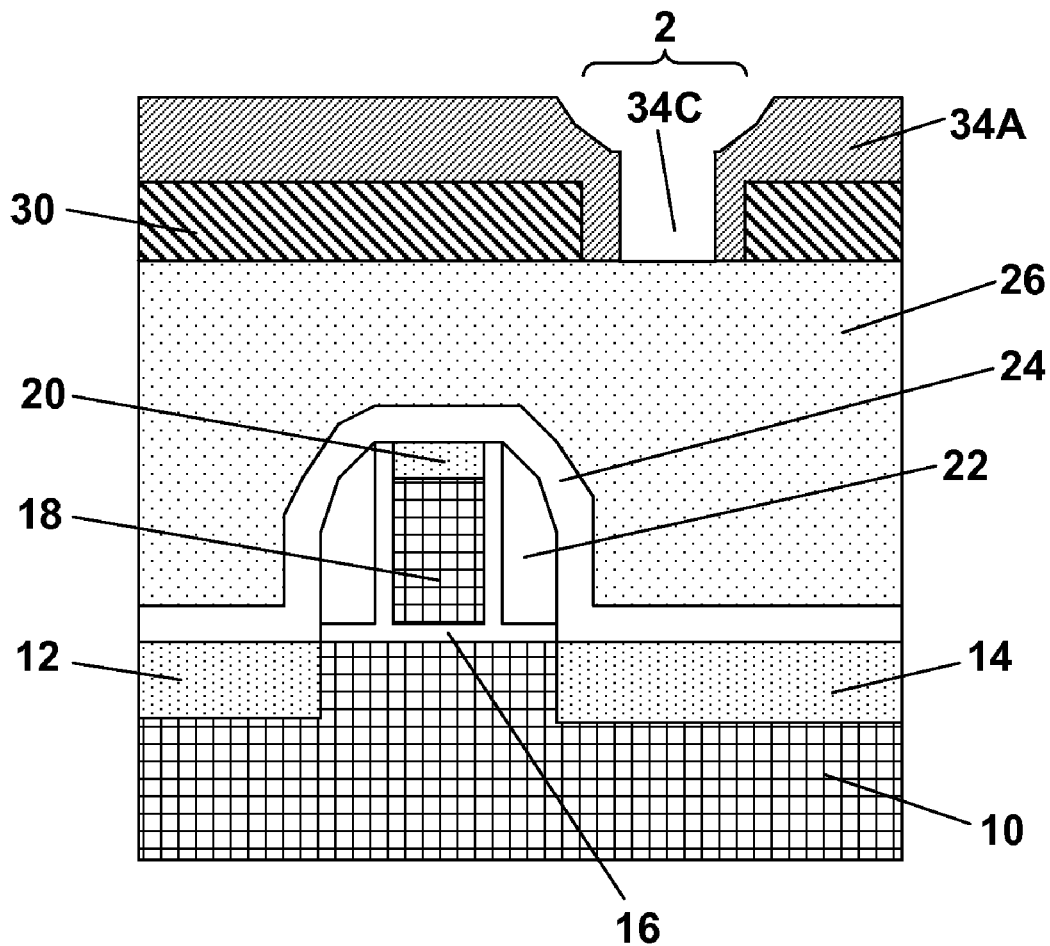
Figure 11B:
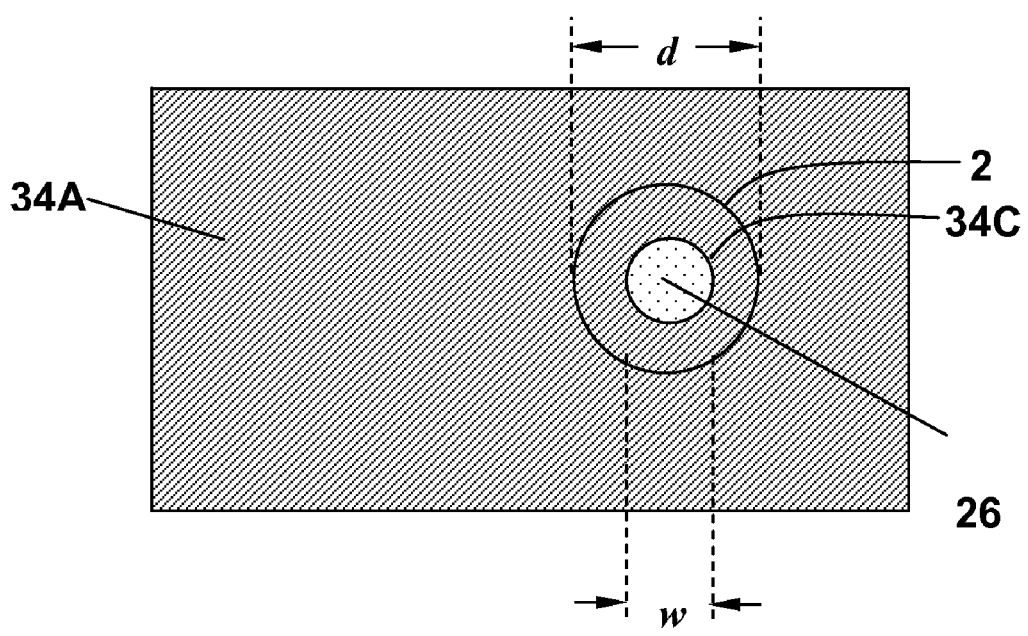

Next, the entire structure as shown in FIGS. 10A and 10B is immersed in an acetic acid solution containing about 62% of acetic acid for a duration of about 1 minutes. The single PMMA cylinder 34A is selectively removed by the acetic acid solution, thereby leaving a singe opening 34C in the PS matrix 34B inside the mask opening 2, as shown in FIGS. 11A and 11B.

Figure 12A:
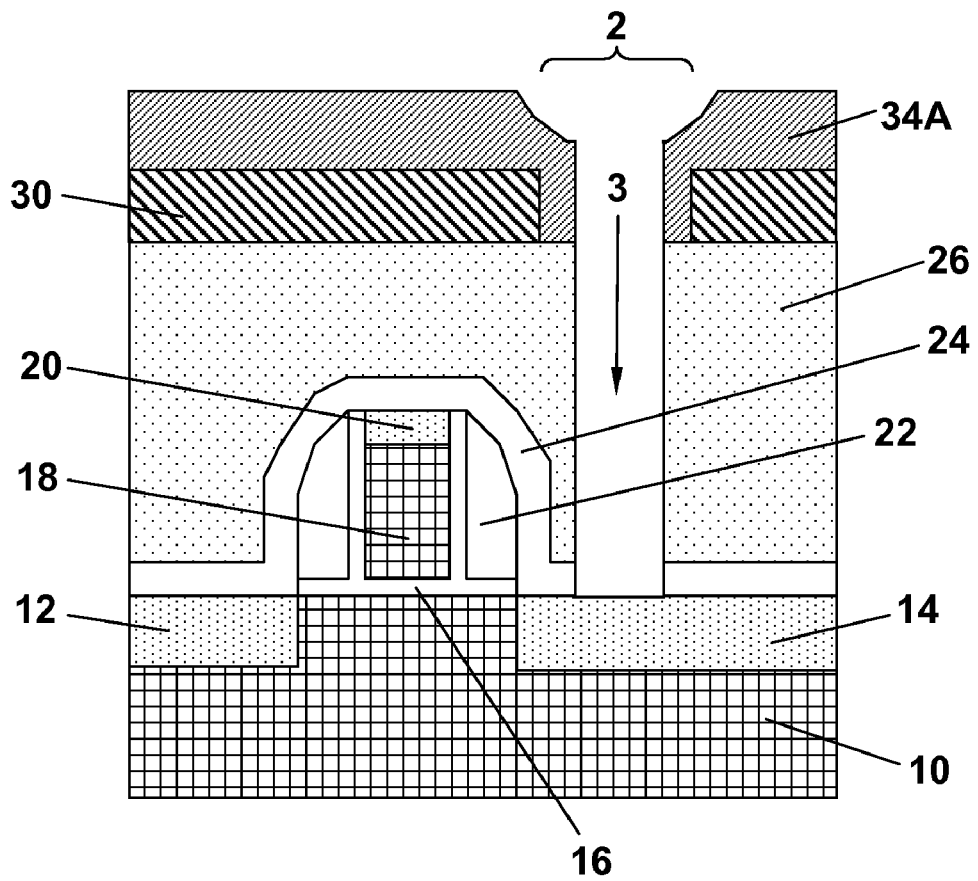
Figure 12B:
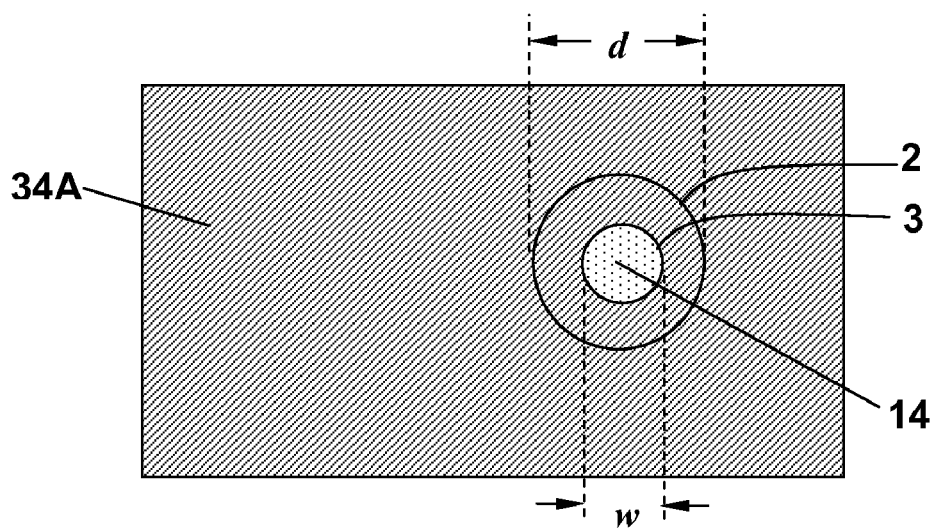

The single opening 34C has the sub-lithographic diameter w and can subsequently be used to pattern the ILD layer 26. Specifically, a contact opening 3 is formed through the ILD layer 26 onto the source or drain metal silicon contact 14 of the FET device by one or more dry and/or wet etching steps, where the polymeric matrix 34A is used as an etching mask, as shown in FIGS. 12A and 12B.

In this manner, the contact opening 3 also has the sub-lithographic diameter w. Such a small contact opening cannot be formed by the conventional lithography techniques and is therefore a unique feature of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming patterned features in a device structure, comprising:

forming a lithographically patterned mask layer on an upper surface of an interlevel dielectric material that is located atop a semiconductor device including a source region and a drain region located within a semiconductor substrate, wherein said lithographically patterned mask layer comprises one or more mask openings of a diameter d and is formed by lithography and etching, said etching does not remove any portion of the interlevel dielectric material;

applying a layer of a block copolymer over the lithographically patterned mask layer, wherein said block copolymer comprises at least first and second polymeric block components A and B, respectively, that are immiscible with each other, said block copolymer comprising polystyrene-block-polymethylmethacrylate (PS-b-PMMA) having a PS:PMMA weight ratio ranging from about 80:20 to about 60:40;

annealing the block copolymer layer by thermal annealing or UV treatment to form a single unit polymer block comprising a single cylinder that stands perpendicular to the upper surface of the device structure and having a diameter w inside each single one of said mask openings, wherein w<d, and each single unit polymer block cylinder is self-aligned to each single mask opening in the lithographically patterned mask layer and comprises the second polymeric block component B and is embedded in a polymeric matrix that comprises the first polymeric block component A;

selectively removing the second polymeric block component B relative to the first polymeric block component A to form a single opening of the diameter w in the polymeric matrix inside each of said mask openings; and patterning the interlevel dielectric material exposing one of the source region and the drain region using the single openings of diameter w.

2. A method of forming patterned features in a device structure, comprising:

forming a lithographically patterned mask layer on an upper surface of an interlevel dielectric material that is located atop a semiconductor device including a source region and a drain region located within a semiconductor substrate, wherein said lithographically patterned mask layer comprises one or more mask openings of a diameter d and is formed by lithography and etching, said etching does not remove any portion of the interlevel dielectric material;

applying a layer of a block copolymer over the lithographically patterned mask layer, wherein said block copolymer comprises at least first and second polymeric block components A and B, respectively, that are immiscible with each other;

annealing the block copolymer layer to form a single unit polymer block of a diameter w inside each of said mask openings, wherein w<d, and wherein each single unit polymer block comprises the second polymeric block component B and is embedded in a polymeric matrix that comprises the first polymeric block component A;

selectively removing the second polymeric block component B relative to the first polymeric block component A to form a single opening of the diameter w in the polymeric matrix inside each of said mask openings; and patterning the interlevel dielectric material exposing one of the source region and the drain region using the single openings of diameter w.

3. The method of claim 2, wherein each single unit polymer block is self-aligned to each mask opening in the lithographically patterned mask layer.

4. The method of claim 2, wherein the block copolymer, when applied and annealed on a planar surface, self assembles into an ordered array of multiple structural units in the polymeric matrix, wherein each of said multiple structural units has the diameter w, wherein said multiple structural units are spaced apart from each other in the ordered array by a distance s, and wherein w<d<3w+2s.

5. The method of claim 2, wherein the block copolymer comprises the first and second polymeric block components A and B, respectively, at a weight ratio of from about 80:20 to about 60:40, and wherein the single unit polymer block comprises a cylinder that stands perpendicular to the upper surface of the device structure.

6. The method of claim 2, wherein the block copolymer is selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PB), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

7. The method of claim 2, wherein the block copolymer comprises PS-b-PMMA having a PS:PMMA weight ratio ranging from about 80:20 to about 60:40.

8. The method of claim 2, wherein thermal annealing or ultra-violet treatment is conducted for annealing the layer of block copolymer.

9. The method of claim 4, wherein (w+s)/2<d<2w+2s.

10. The method of claim 4, wherein w ranges from about 10 nm to about 50 nm, wherein s ranges from about 20 nm to about 60 nm, and wherein d ranges from about 40 nm to about 200 nm.

* * * * *